(12) United States Patent
Kumar et al.

(10) Patent No.: US 10,148,279 B2
(45) Date of Patent: Dec. 4, 2018

(54) DIGITAL TO ANALOG CONVERSION WITH CORRELATED ELECTRON SWITCH DEVICES

(71) Applicant: ARM Ltd., Cambridge (GB)

(72) Inventors: Akshay Kumar, New Delhi (IN); Piyush Agarwal, Noida (IN); Bal S. Sandhu, Fremont, CA (US); Glen Arnold Rosendale, Palo Alto, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/859,069

(22) Filed: Dec. 29, 2017

(65) Prior Publication Data

US 2018/0152197 A1 May 31, 2018

Related U.S. Application Data

(63) Continuation of application No. 15/364,507, filed on Nov. 30, 2016, now Pat. No. 9,871,528.

(51) Int. Cl.
*H03M 1/10* (2006.01)
*H03M 1/66* (2006.01)
*H01L 45/00* (2006.01)

(52) U.S. Cl.
CPC .......... *H03M 1/1071* (2013.01); *H01L 45/04* (2013.01); *H01L 45/146* (2013.01); *H03M 1/1009* (2013.01); *H03M 1/66* (2013.01); *H05K 999/99* (2013.01)

(58) Field of Classification Search
CPC ..... H03M 1/1071; H03M 1/1009; H03M 1/66
USPC .................................................. 341/120–155
See application file for complete search history.

(56) References Cited

U.S. PATENT DOCUMENTS

| 5,808,576 | A | 9/1998 | Chloupek et al. |
| 7,298,640 | B2* | 11/2007 | Chen ........................ G11C 11/16 |
| | | | 257/E27.004 |
| 7,639,523 | B2* | 12/2009 | Celinska ................. H01L 45/04 |
| | | | 365/148 |
| 7,778,063 | B2* | 8/2010 | Brubaker ............ H01L 27/2409 |
| | | | 365/148 |
| 7,872,900 | B2* | 1/2011 | Paz de Araujo ........ H01L 45/04 |
| | | | 365/148 |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 9,773,550 | B2* | 9/2017 | Bhavnagarwala ........................... |
| | | | G11C 13/0069 |
| 9,871,528 | B1* | 1/2018 | Kumar ................ H03M 1/1071 |

(Continued)

FOREIGN PATENT DOCUMENTS

WO      2015163928 A1      10/2015

OTHER PUBLICATIONS

Notification of Transmittal of the International Search Report and the Written Opinion of the International Searching Authority, or the Declaration, dated Feb. 13, 2018, International Patent Application No. PCT/GB2017/053605, 1 pg.

(Continued)

*Primary Examiner* — Lam T Mai
(74) *Attorney, Agent, or Firm* — Berkeley Law & Technology Group, LLP

(57) ABSTRACT

Subject matter disclosed herein may relate to correlated electron switch devices, and may relate more particularly to digital to analog conversion using correlated electron switch devices ces.

19 Claims, 12 Drawing Sheets

(56) References Cited

U.S. PATENT DOCUMENTS

| | | | |
|---|---|---|---|
| 2008/0106928 A1 | 5/2008 | Brubaker | |
| 2008/0107801 A1* | 5/2008 | Celinska | H01L 45/04 |
| | | | 427/96.7 |
| 2010/0283028 A1 | 11/2010 | Brubaker et al. | |
| 2013/0200323 A1 | 8/2013 | Pham et al. | |
| 2013/0214232 A1 | 8/2013 | Tendulkar et al. | |
| 2013/0285699 A1* | 10/2013 | McWilliams | H03K 19/173 |
| | | | 326/41 |
| 2017/0033782 A1* | 2/2017 | Shifren | G11C 13/004 |
| 2017/0045905 A1 | 2/2017 | Sandhu et al. | |
| 2017/0047116 A1 | 2/2017 | Sandhu et al. | |
| 2017/0047919 A1* | 2/2017 | Sandhu | G11C 13/0069 |
| 2017/0069378 A1 | 3/2017 | Shifren et al. | |
| 2017/0099049 A1* | 4/2017 | Sandhu | H03K 17/687 |
| 2017/0178724 A1* | 6/2017 | Bhavnagarwala | G11C 13/004 |
| 2017/0206963 A1* | 7/2017 | Bhavnagarwala | G11C 13/004 |

OTHER PUBLICATIONS

The International Search Report, dated Feb. 13, 2018, International Patent Application No. PCT/GB2017/053605, 6 pgs.

The Written Opinion of the International Searching Authority, dated Feb. 13, 2018, International Patent Application No. PCT/GB2017/053605, 8 pgs.

Application as Filed, filed Nov. 30, 2016, U.S. Appl. No. 15/364,50, 75 pgs.

Non-Final Office Action, dated May 3, 2017, U.S. Appl. No. 15/364,50, 6 pgs.

Response to Non-Final Office Action, filed Aug. 29, 2017, U.S. Appl. No. 15/364,50, 17 pgs.

Notice of Allowance, dated Sep. 7, 2017, U.S. Appl. No. 15/364,50, 11 pgs.

Issue Fee as Filed, Filed Dec. 7, 2017, U.S. Appl. No. 15/364,50, 6 pgs.

* cited by examiner

DIGITAL TO ANALOG CONVERSION WITH CORRELATED ELECTRON SWITCH DEVICES

This application is a continuation of U.S. patent application Ser. No. 15/364,507, titled DIGITAL TO ANALOG CONVERSION WITH CORRELATED ELECTRON SWITCH DEVICES, filed Nov. 30, 2016, and is incorporated herein by reference in its entirety.

BACKGROUND

Field

Subject matter disclosed herein may relate to correlated electron switch devices, and may relate more particularly to digital to analog conversion using correlated electron switch devices.
Information:
Integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an illustration of an example symbol for a correlated electron switch device, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe example embodiments utilizing electron materials (CEMs) in correlated electron switch (CES) devices, for example, such as may be utilized to form a correlated electron random access memory (CERAM) in memory and/or logic devices, and/or such as may be utilized in any number of other circuit and/or device types, for example. Correlated electron materials, which may be utilized in the construction of CERAM devices and CES devices, for example, may also be utilized in a wide range of other electronic circuit types, such as, for example, memory controllers, memory arrays, processors, microcontrollers, filter circuits, data converters, optical instruments, phase locked loop circuits, microwave and millimeter wave transceivers, and so forth, although claimed subject matter is not limited in scope in these respects. In this context, a CES device may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CES device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CES device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, transitioning from a relatively insulative/higher impedance state to a substantially dissimilar and relatively conductive/lower impedance state may bring about a change in capacitance in addition to a change in resistance. For example, a CEM may exhibit a variable resistance together with a property of variable capacitance. In other words, impedance characteristics of a CEM may include both resistive and capacitive components. For example, in a metal state, a CEM may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

Figure 1A:
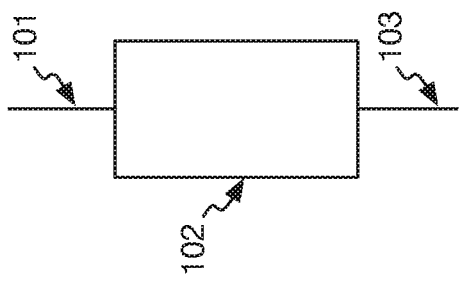
FIG. 1a shows block diagram of an example embodiment of a correlated electron switch device comprising a correlated electron material, in accordance with an embodiment.

FIG. 1a shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
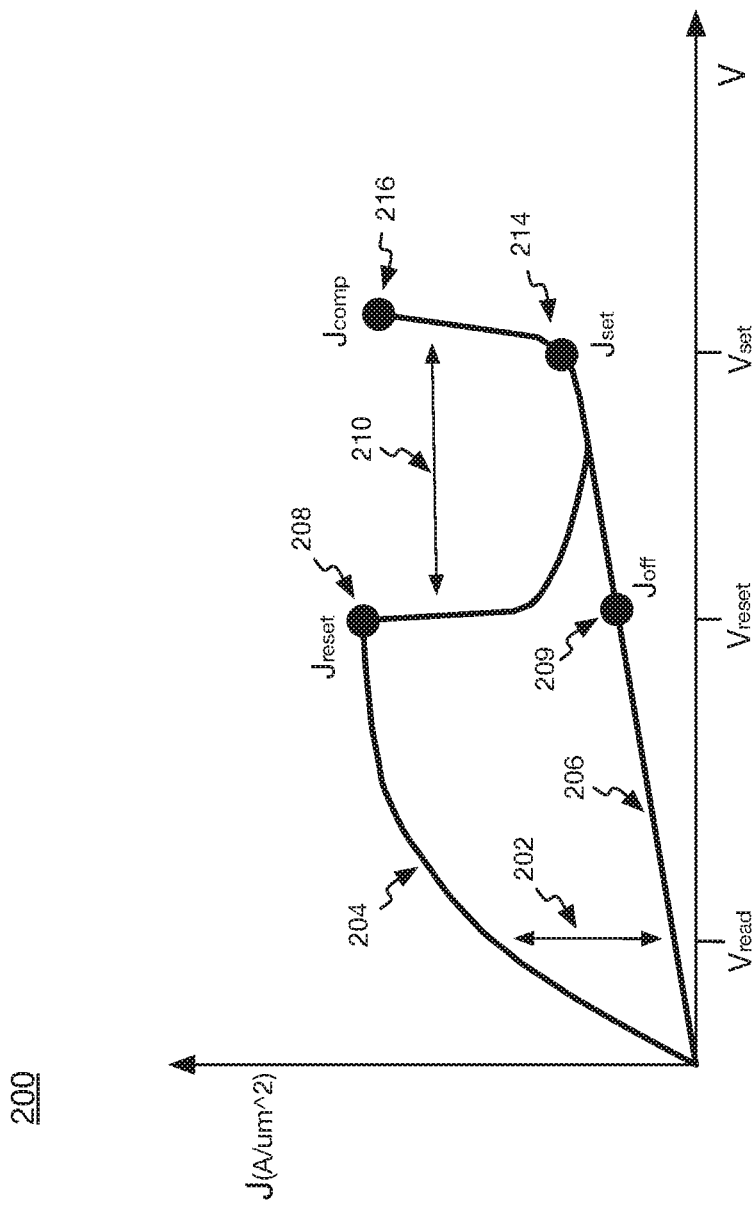
FIG. 2 shows an example plot of current density versus voltage for a correlated electron switch device, in according to an embodiment.

FIG. 2 is a diagram showing an example voltage versus current density profile of a device formed from a CEM according to an embodiment 200. Based, at least in part, on a voltage applied to terminals of a CEM device, for example, during a "write operation," a CEM device may be placed into a relatively low-impedance state or a relatively high-impedance state. For example, application of a voltage $V_{set}$ and a current density Jset may place a CEM device into a relatively low-impedance memory state. Conversely, application of a voltage $V_{reset}$ and a current density $J_{reset}$ may place a CEM device into a relatively high-impedance memory state. As shown in FIG. 2, reference designator 210 illustrates the voltage range that may separate $V_{set}$ from $V_{reset}$. Following placement of a CEM device into an high-impedance state or low-impedance state, the particular state of a CEM device may be detected by application of a voltage $V_{read}$ (e.g., during a read operation) and detection of a current or current density at terminals of a CEM device.

According to an embodiment, a CEM device of FIG. 2 may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, a CEM device of FIG. 2 may comprise materials of the general form AB:$L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$ which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dO_f$ (in which a≥1, and b, d and f≥0) such as: carbonyl (CO), cyano (CN$^-$), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS$^-$), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively high-impedance material. If a CEM device comprises a relatively high-impedance state, current may be generated by transportation of electron holes. Consequently, if a threshold voltage is applied across terminals of a CEM device, electrons may be injected into a metal-insulator-metal (MIM) diode over the potential barrier of the MIM device. If a threshold current of electrons is injected and a threshold potential is applied across terminals to place a CEM device into a "set" state, an increase in electrons may screen electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place a CEM device into a relatively high-impedance state. This externally-applied compliance current may, in some embodiments, also set a condition of a current density for a subsequent reset operation to place a CEM device into a relatively high-impedance state. As shown in the particular implementation of FIG. 2, a current density $J_{comp}$ may be applied during a write operation at point 116 to place a CEM device into a relatively high-impedance state, may determine a compliance condition for placing a CEM device into a low-impedance state in a subsequent write operation. As shown in FIG. 2, a CEM device may be subsequently placed into a low-impedance state by application of a current density $J_{reset} \geq J_{comp}$ at a voltage $V_{reset}$ at point 208, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to a CEM device for subsequently transitioning a CEM device to a relatively high-impedance memory state.

As pointed out above, a reset condition may occur in response to a Mott transition at point 208. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by NH in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through a CEM device to be applied to a CEM device at a threshold voltage $V_{MI}$, which may place a CEM device in a relatively high-impedance state.

Figure 3:
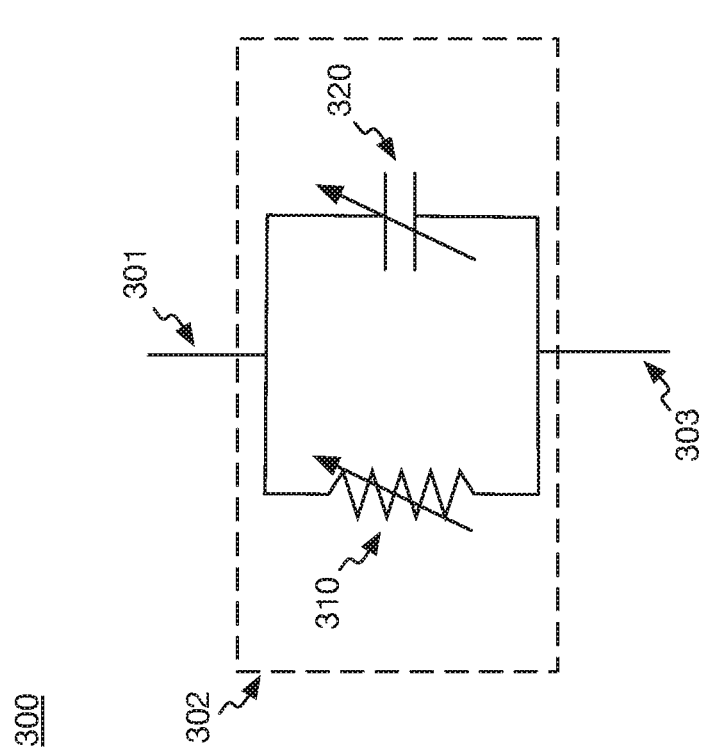
FIG. 3 is a schematic diagram of an equivalent circuit of a correlated electron switch, in accordance with an embodiment.

FIG. 3 depicts a schematic diagram of an equivalent circuit of an example CEM switch device according to an embodiment 300. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as the device according to embodiment 300, may depend at least in part on resistance and capacitance characteristics of the device if measured across device terminals 301 and 302, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the device of embodiment 300.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, Table 1 shows that a resistance of a variable impedance device, such as the device of embodiment 300, may transition between a low-impedance state and a substantially dissimilar high-impedance state as a function at least partially dependent on a voltage applied across a CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 300, may transition between a relatively lower capacitance state, which, in an example embodiment, may comprise approximately zero, or very little, capacitance, and a relatively higher capacitance state that is a function, at least in part, of a voltage applied across a CEM device.

According to an embodiment, a CEM device, which may be utilized to form a CEM switch, a CERAM memory device, and/or a variety of other electronic devices comprising one or more correlated electron materials, may be placed into a relatively lower-impedance memory state, such as by transitioning from a relatively higher-impedance state, for example, via injection of a sufficient quantity of electrons to satisfy a Mott transition criteria. In transitioning a CEM device to a relatively lower-impedance state, if enough electrons are injected and the potential across the terminals of a CEM device overcomes a threshold switching potential (e.g., $V_{set}$), injected electrons may begin to screen. As previously mentioned, screening may operate to un-localize double-occupied electrons to collapse the band-splitting potential, thereby bringing about a relatively lower-impedance state.

As mentioned, integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

In an embodiment, it may be desirable and/or advantageous to utilize CES devices in digital-to-analog conversion operations. For example, CES devices may utilize relatively far less integrated circuit die area than, for example, n-well type resistor devices that may otherwise be utilized in digital-to-analog conversion circuitry. Also, for example, CES devices may exhibit less manufacturing process variation than n-well type resistor devices. Further, CES devices may exhibit relatively less temperature variation under operating conditions as compared with, for example, n-well type resistor devices. Additionally, it may be advantageous and/or desirable to utilize the programmable impedance characteristics of CES devices in digital-to-analog conversion circuitry to allow multiple modes of operation, as discussed more fully below.

Figure 4:
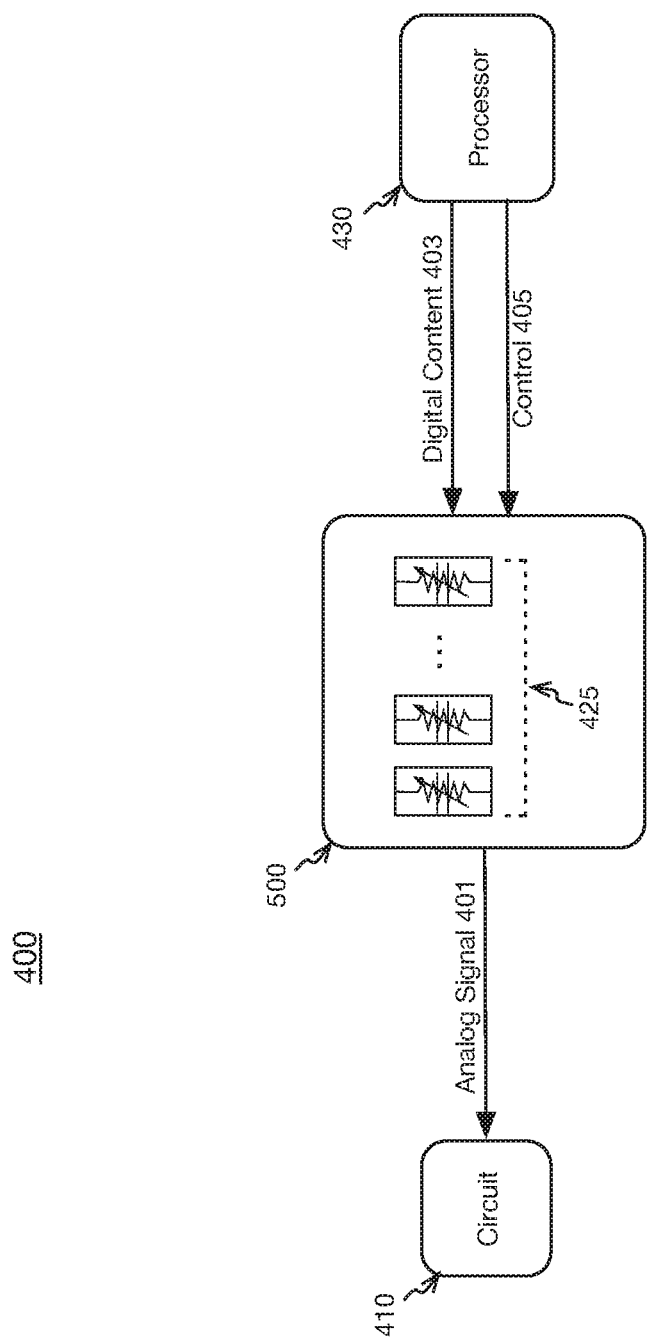
FIG. 4 depicts a schematic block diagram of an example circuit for digital to analog conversion, in accordance with an embodiment.

FIG. 4 depicts a schematic block diagram of an embodiment 400 of an example system for digital to analog conversion, in accordance with an embodiment. In an embodiment, a processor, such as processor 430, may provide digital content, such as digital content 403, to digital-to-analog conversion circuitry, such as example digital-to-analog circuit 500, and the digital-to-analog conversion circuitry may generate an output signal, such as analog signal 401, based at least in part on one or more characteristics of the digital content, such as digital content 403. For example, digital content, such as digital content 403, may comprise one or more values indicated by one or more parameters. In an embodiment, digital content parameters may comprise a binary code including a plurality of individual binary bits, as discussed more fully below.

In an embodiment, an output signal, such as analog signal 401, may be generated by digital-to-analog circuitry, such as example digital-to-analog circuit 500, based at least in part on one or more parameters, such as one or more bits of digital content 403, such that the generated output signal, such as analog signal 401, is representative of a value indicated by the one or more parameters, such as the one or more bits of digital content 403. Additionally, an output signal, such as analog signal 401, may be generated based at least in part on impedance states of one or more CES devices, such as one or more of CES devices 425, for example.

In an embodiment, one or more CES devices, such as one or more of CES devices 425, may be programmable. For example, one or more CES devices, such as one or more of CES devices 425, may be individually programmable and/or may be collectively programmable. For example, CES devices 425 may be programmed to a relatively higher impedance state to induce a relatively lower current, relatively lower power consumption mode of operation for example digital-to-analog circuit 500. Further, CES devices 425 may be programmed to a relatively lower impedance state to induce a relatively higher current, relatively higher power consumption mode of operation for example digital-to-analog circuit 500, for example. A relatively lower impedance state may also result in quicker signal transitions during digital-to-analog conversion operations, in an embodiment. In this manner, the programmable nature of CES devices, such as CES devices 425, may provide additional flexibility over what is possible using other technologies, such as n-well resistor technologies, for example, to implement digital-to-analog conversion circuitry.

In an embodiment, control signals, such as control signals 405, may be generated, such as by example processor 430, to control programming operations for one or more CES devices, such as one or more CES devices 425 of example digital-to-analog conversion circuit 500. Example programming operations and/or example impedance states for CES devices that may be utilized in digital-to-analog conversion operations are discussed more fully below.

Additionally, in an embodiment, an output signal, such as analog signal 401, may be provided to a circuit, such as example circuit 410. In an embodiment, a circuit, such as example circuit 410, may comprise any of a wide range of circuit types that may utilize a signal, such as analog signal 401, that may be modulated and/or varied depending at least in part on digital content, such as digital content 403. Example circuit types that may utilize output signals from digital-to-analog conversion operations may include, for example, audio circuits, video circuits, and/or communications circuits, although claimed subject matter is not limited in scope in these respects.

Figure 5:
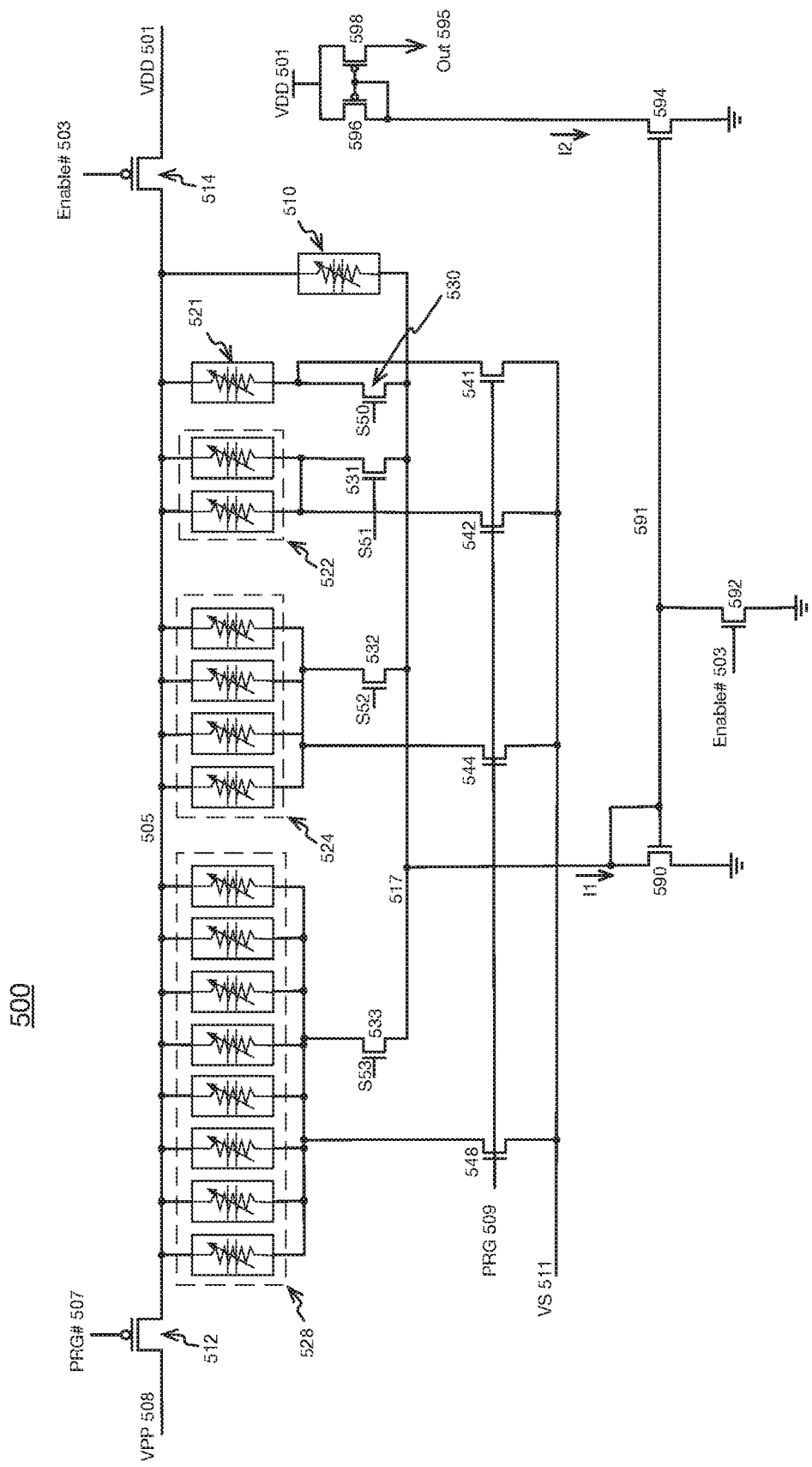
FIG. 5 depicts a schematic block diagram of an example circuit for linear digital to analog conversion including a plurality of programmable example correlated electron switch devices, in accordance with an embodiment.

FIG. 5 depicts a schematic block diagram of an embodiment 500 of an example circuit for approximately linear digital-to-analog conversion. Example embodiment 500 may including a plurality of programmable example CES devices, in an embodiment. For example, a plurality of CES devices may be configured in a plurality of "banks," such as banks 521, 522, 524, and/or 528. As utilized herein, the term "bank" refers to a grouping of one or more CES devices. For example, bank 521 includes a single CES device, for an example embodiment. Bank 522 may include a pair of CES devices, bank 524 may include four CES devices, and/or bank 528 may include eight CES devices, in an embodiment. Of course, claimed subject matter is not limited in scope to the particular arrangement and/or configuration of CES devices depicted and/or described in the example embodiments included herein.

Example embodiment 500 may comprise a four-bit current-mode digital-to-analog conversion circuit that may operate in a weighted-impedance configuration. As mentioned, CES devices, such as CES devices of banks 521, 522, 524, and/or 528, may be utilized as impedance elements that may be programmed to different impedance states. Although example embodiment 500 depicts and/or describes a four-bit digital-to-analog conversion circuit, other embodiments may be implemented utilizing other bit depths, for example. Further, although example embodiment 500 comprises an example current-mode digital-to-analog conversion circuit, other embodiments may comprise voltage-mode digital-to-analog conversion circuits. Additionally, the impedance weighting characteristics of embodiment 500, such as implemented via banks 521, 522, 524, and/or 528 having different amounts of CES devices, are merely examples, and claimed subject matter is not limited in scope in these respects.

In an embodiment, a plurality of switching devices, such as switching devices 530, 531, 532, and/or 533, which may comprise NMOS transistors, for example, may be enabled individually in accordance with digital content signals S50, S51, S52, and/or S53. In an embodiment, signal S53 may represent a most-significant bit of digital content to be converted to an analog signal. Further, in an embodiment, signal S50 may represent a least-significant bit of the digital content. Depending at least in part on the individual logical states of input signals S50-S53, one or more of switching devices 530-533 may be enabled, thereby permitting current flow through respective banks of CES devices, in an embodiment. For example, at least in part in response to input signal S50 comprising a logically high voltage level, switching device 530 may be enabled thereby permitting current flow between a node 505 and a node 517 through CES device bank 521. Similarly, for example, at least in part in response to input signal S51 comprising a logically high voltage level, switching device 531 may enable current flow between node 505 and node 517 through CES device bank 522. Likewise, a logically high voltage level for input signals S52 and/or S53 may enable switching devices 532 and/or 533, respectively, to enable current flow between node 505 and node 517 through CES device banks 523 and/or 524, respectively. Further, in an embodiment, an output signal, such as Out 595, may comprise an output current signal that may be representative of one or more values indicated by digital content, such as one or more values indicated by input signals S50-S53.

During normal digital-to-analog conversion operation for example embodiment 500, a programming signal, such as PRG 509, may be de-asserted, and an enable signal, such as Enable#503, may be asserted. As utilized herein, the term "asserted" and the like in the context of a high-enabled signal (e.g., PRG 509) refers to a logically high voltage level (binary "1") and "non-asserted" and/or "de-asserted" and the like refer to a logically low voltage level (binary "0"). Similarly, "asserted" and the like in the context of a low-enabled signal (e.g., Enable#503) refers to a logically low voltage level, and "non-asserted" and/or "de-asserted" and the like refer to a logically high voltage level. At least in part in response to an assertion of Enable#503, switching device 514, which may comprise a PMOS transistor, for example, may electrically couple supply voltage VDD 501 to node 505.

Further, in an embodiment, to program CES devices of banks 521, 522, 524, and/or 528, a programming signal, such as PRG 509, may be asserted and Enable#509 may be de-asserted. Assertion of PRG 509 may enable switching devices 541, 542, 544, and/or 548, which may comprise NMOS transistors, for example, to permit current flow between CES device banks 521, 522, 524, and/or 528 and a node VS 511. Further, in an embodiment, by asserting PRG 509 and PRG#507, a programming voltage, such as VPP 508, may be applied across CES device banks 521, 522, 524, and/or 528 between node 505 and node VS 511. For example, an assertion of PRG#507 may electrically couple a programming voltage, such as VPP 508, to node 505 by enabling a switching device, such as switching device 512, which may comprise a PMOS transistor, for example. In an embodiment, VS 511 may comprise a ground voltage level, although claimed subject matter is not limited in scope in this respect. Additionally, in an embodiment, to program CES devices of banks 521, 522, 524, and/or 528 to a relatively higher impedance state, a programming voltage, such as VPP 508, may be set to approximately 0.7V to induce a reset condition. Further, in an embodiment, to program the CES devices of banks to a relatively lower impedance state, VPP 508 may be set to approximately 1.3V to induce a set condition.

In other embodiments, VPP 508 and/or VS 511 may be set to voltage levels appropriate to apply particular compliance current levels to one or more CES devices, thereby programming one or more CES devices to particular impedance levels, for example. Compliance current control and/or programming for CES devices in example embodiments of digital-to-analog conversion circuitry are discussed more fully below.

In an embodiment, size and/or strength characteristics for switching devices 541, 542, 544, and/or 548 may be selected by a circuit designer according to an amount of CES devices in the particular banks, such as banks 521, 522, 524, and/or 528. Further, in an embodiment, a CES device, such as CES device 510, may under normal operating conditions conduct current between node 505 and node 517, and is not enabled and/or disabled via a switching device, as may be the case with other CES devices, such as CES devices of banks 521, 522, 524, and/or 528. In an embodiment, a CES device, such as CES device 510, may be utilized to calibrate the current output. For example, comparisons may be made between the current level observed and/or measured in response to digital content comprising input signals S53-S50 indicating a binary value of 0000b and various current levels observed and/or measured in response to digital content comprising input signals S53-S50 indicating binary values ranging from 0001b to 1111b, in an embodiment. In an embodiment, for a four-bit digital-to-analog conversion circuit, such as example embodiment 500, a ratio of output current such as may be generated at Out 595 in response to digital content indicating a binary value of 1111b to output current such as may be generated at Out 595 in response to digital content indicating a binary value of 0000b may be 16, although claimed subject matter is not limited in scope in this respect.

In an embodiment, switching devices, such as switching devices 590, 594, 596, and/or 598 may comprise a current mirror circuit to generate an output current signal, such as Out 595. In an embodiment, at least in part in response to an enable signal, such as Enable#503, being de-asserted, switching device 592, which may comprise an NMOS transistor, for example, may be enabled to substantially conduct current, thereby electrically connecting a node, such as node 591, to a ground reference voltage level, for example. At least in part in response to node 591 being pulled to a ground reference voltage, switching devices, such as switching devices 590 and/or 594, which may comprise NMOS transistors, for example, may be not enabled, and substantially no current may flow through switching devices 590 and/or 594, in an embodiment. At least in part in response to switching device 594 being not enabled, substantially no current may be developed by switching devices 596 and/or 598, for example. Further, in an embodiment, at least in part in response to an assertion of Enable#503, node 591 may not be pulled to a ground reference voltage level, and switching devices 590 and/or 594 may become enabled. At least in part in response to switching devices 590 and/or 594 being enabled, current may flow through switching devices 590 and/or 594 (e.g., indicated in FIG. 5 by "I1" and "I2", respectively), and further switching devices 596 and/or 598 may generate output signal Out 595. As discussed above, the current level of Out 595 may depend at least in part on which of switching devices 530-533 are enabled in response to digital content comprising input signals S53-S50, in an embodiment.

In an embodiment, such as example embodiment 500, relatively higher output current levels may be achieved at least in part in response to programming CES devices of banks 521, 522, 524, and/or 528 to a relatively lower impedance state. Further, in an embodiment, relatively lower power consumption levels may be achieved via relatively lower current levels at least in part by programming CES devices of banks 521, 522, 524, and/or 528 to a relatively higher impedance state.

As mentioned, claimed subject matter is not limited to the example four-bit digital-to-analog conversion circuit depicted in FIG. 5 and as described above. For example, for an "n"-bit digital-to-analog conversion circuit in accordance with an embodiment, a bank of CES devices for a most-significant bit may utilize $2^{n-1}$ CES devices configured in parallel. As also mentioned previously, implementations utilizing CES devices may utilize relatively much less integrated circuit die area than implementations utilizing, for example, n-well resistor devices. Additionally, as mentioned, improvements may also be exhibited with respect to manufacturing process variation and/or with respect to temperature variation.

Figure 6:
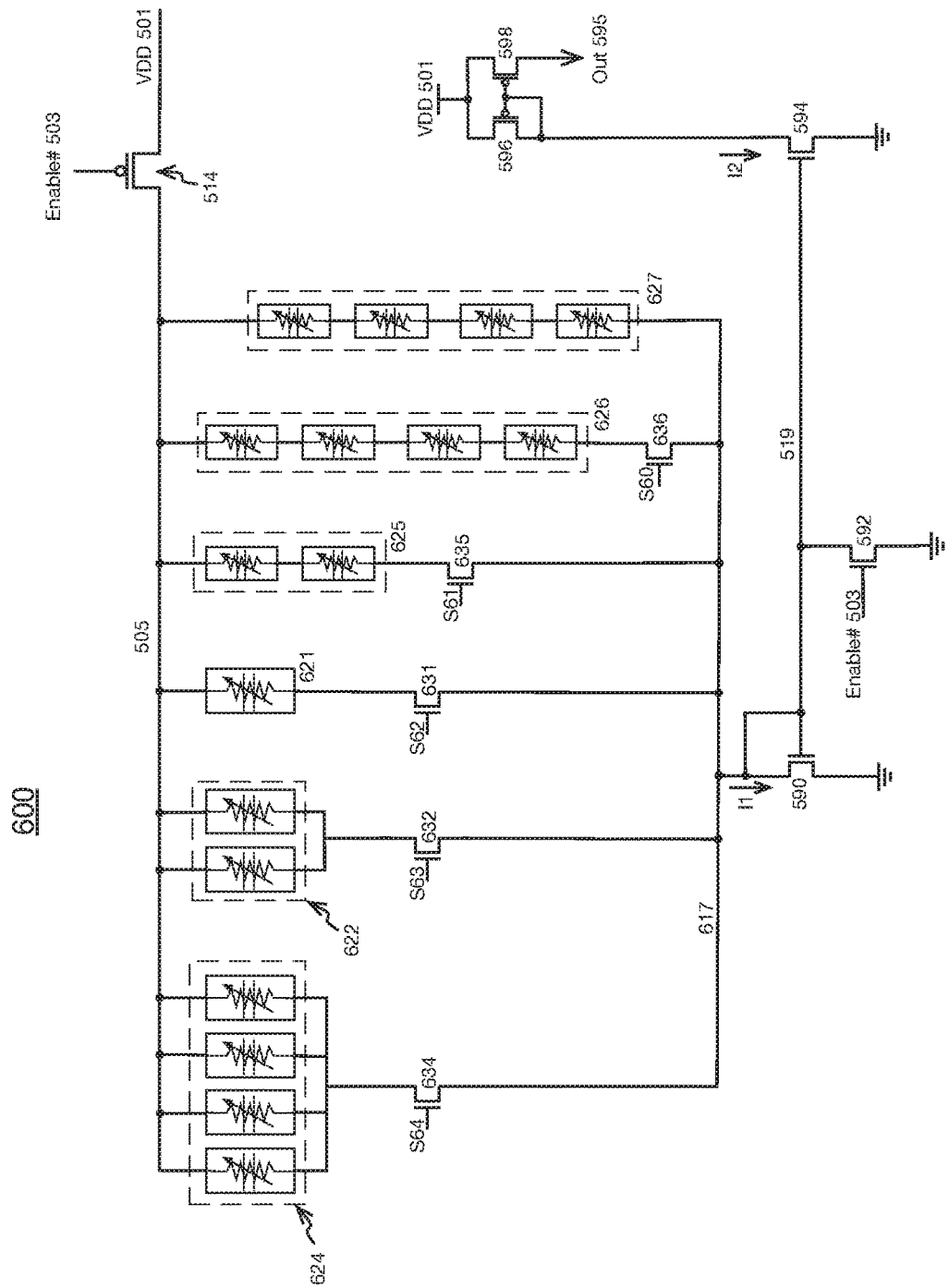
FIG. 6 is a schematic block diagram depicting an additional example circuit for linear digital to analog conversion including a plurality of programmable example correlated electron switch devices, in accordance with an embodiment.

FIG. 6 is a schematic block diagram depicting an additional example embodiment 600 of a circuit for approximately linear digital-to-analog conversion including a plurality of programmable example CES devices. Example embodiment 600 may comprise a "higher bit" digital-to-analog conversion circuit. In an embodiment, a single CES device, such as 621, may be positioned substantially in the center of a configuration of multiple banks of CES devices. In an embodiment, series and/or parallel combinations of CES devices may be utilized within particular banks of CES devices to implement desired impedance ratios. In an embodiment, utilization of parallel-configured CES device banks, such as banks 624 and/or 622 for more significant bits and serially-configured CES device banks, such as banks 625, 626, and/or 627, for less significant bits may permit a reduction in CES devices utilized to implement a conversion circuit.

In an embodiment, utilization of a configuration similar to that described for example embodiment 500, discussed above, for an eight-bit digital-to-analog conversion circuit may utilize as many as 128+64+32+16+8+4+2+1=255 CES devices. However, an example configuration for an eight-bit digital-to-analog conversion circuit similar to that of example embodiment 600 may utilize 8+4+2+1+2+4+8+16=45 CES devices, in an embodiment.

In an embodiment, one or more CES device banks, such as one or more of banks 621, 622, 624, 625, 626, and/or 627, may be electrically coupled between node 505 and node 617. In an embodiment, one or more of banks 621, 622, 624, 625, and/or 626 may be electrically coupled between node 505 and node 617 via one or more switching devices 631, 632, 634, 635, and/or 636 at least in part in accordance with the logical voltage levels of digital content input signals S60, S61, S62, S63, and/or S64, for example. In an embodiment, switching devices 631, 632, 634, 635, and/or 636 may comprise NMOS transistors, although claimed subject matter is not limited in scope in this respect. Also, in an embodiment, programmability of one or more serially-configured CES device banks, such as banks 625, 626, and/or 627, may be affected due at least in part to increased voltage and/or current levels that may be utilized to achieve impedance state transition in serially-coupled CES devices. Further, in an embodiment, switching devices, such as switching devices 631, 632, 634, 635, and/or 636 may be designed to comprise thick-gate devices to support programming of serially-coupled CES devices due to the increased voltage and/or current levels, for embodiments that support such programmability. For example embodiment 600, CES device banks 621, 622, 624, 625, 626, and/or 627 may not be programmable. However, other embodiments may implement programming of one or more CES device banks, and may utilize circuitry similar to that depicted in FIG. 5, for example. Further, in an embodiment, example circuit 600 may utilize similar current mirror circuitry to that discussed above in connection with example embodiment 500 to generate an output current signal, such as Out 595. Example embodiment 600 may also utilize other control and/or programming and/or voltage delivery circuitry similar to that discussed above in connection with example embodiment 500 but not depicted in FIG. 6.

Figure 7:
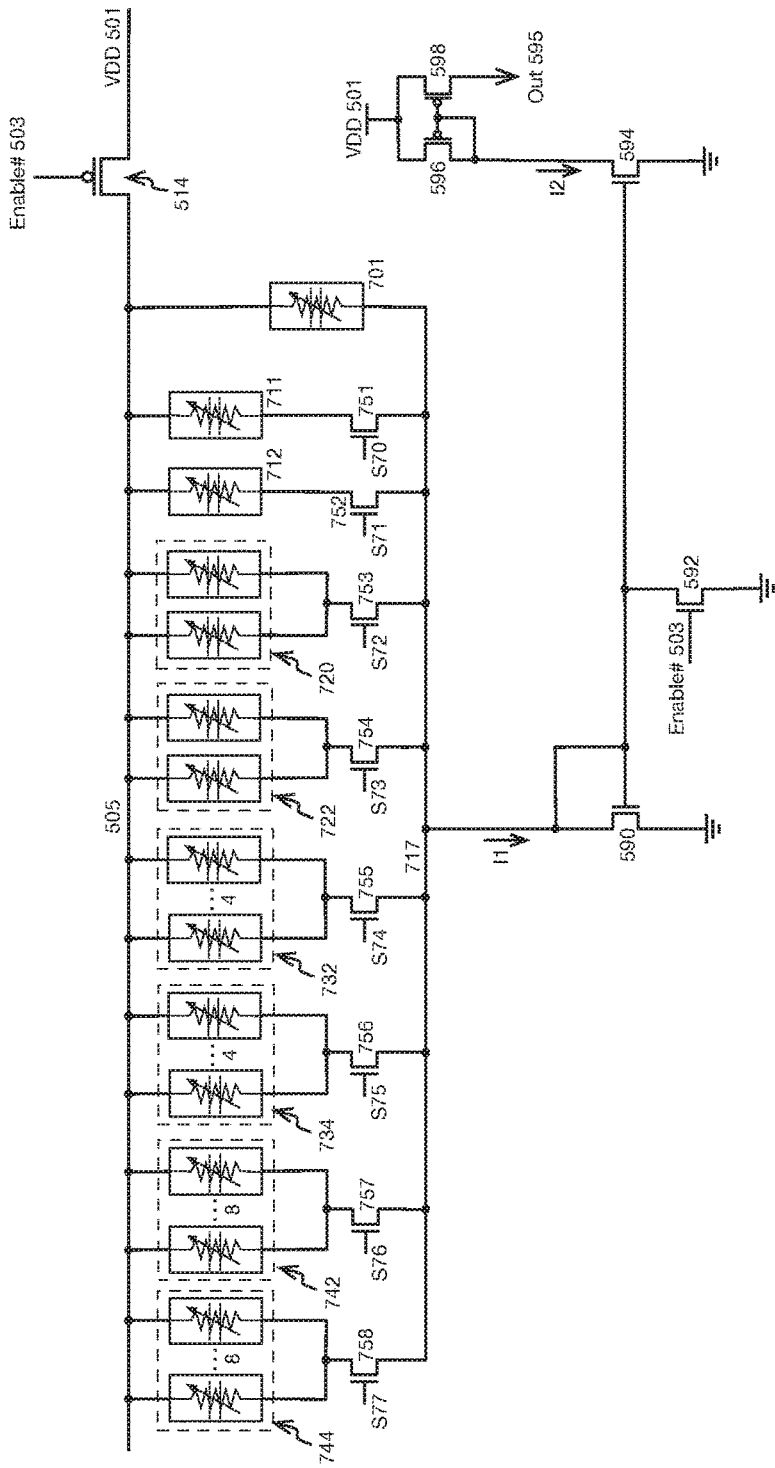
FIG. 7 is a schematic diagram depicting an example circuit for non-linear digital to analog conversion including a plurality of programmable example correlated electron switch devices, in accordance with an embodiment.

FIG. 7 is a schematic diagram depicting an embodiment 700 of a circuit for non-linear digital-to-analog conversion. Note that embodiment 700 may utilize similar current mirror circuitry to that discussed above in connection with example embodiment 500 to generate an output current signal, such as Out 595. Further, example embodiment 700 may also utilize other control and/or programming and/or voltage delivery circuitry similar to that discussed above in connection with example embodiment 500 but not depicted in FIG. 7. However, claimed subject matter is not limited in scope in these respects.

In an embodiment, to provide additional control over the weight of individual bits in digital content input signals, such as input signals S77-S70, impedances for one or more individual banks of CES devices, such as banks 720, 722, 732, 734, 742, and/or 744, may be selectable between a particular amount of impedance (1Z) and a doubled amount of impedance (2Z). Such control may yield a substantially non-linear digital-to-analog conversion circuit, in an embodiment. For example, for a case in which S70, S72, S74 and S76 are asserted, impedances related to CES device banks 711, 720, 732, and 742 contribute to the overall impedance affecting current I1 on node 717, and therefore affecting output current signal Out 595. For this example, impedances for the selected banks may comprise Z, Z/2, Z/4, and Z/8. However, for another example, for a case in which S70 and S71 are asserted together, and S72 and S73 are asserted together, and S74 and S75 are asserted together, and S76 and S77 are also asserted together, the resulting impedances comprise Z/2, Z/4, Z/8, and Z/16.

To configure weights of individual bits of digital content input signals, such as input signals S77-S70, different numbers of CES devices to be configured in parallel for individual CES banks, such as CES device banks 711, 720, 732, and 742, may be specified by a circuit designer, in an embodiment. For example, weight relationships of 8-4-2-1 (e.g., linear), 16-4-2-1 (e.g., non-linear with relatively sharper transition between input signal binary codes), 16-8-2-1, 16-8-4-1, and/or 16-8-4-2 may be achieved. However, these are merely example possible configurations, and claimed subject matter is not limited in scope in these respects.

Further, in an embodiment, other weight combinations and/or configurations may be utilized in situations where a reduction and/or loss of monotonicity is not an issue. As used herein, the term "monotonicity" refers to a characteristic of a digital-to-analog conversion circuit wherein a magnitude of an analog output signal may increase whenever the digital input signal may be incremented. In an embodiment, weighted-impedance digital-to-analog conversion may become non-monotonous in response to a ratio of weights of two successive stages of pairs of CES banks becomes less than two, for example.

Also, additional embodiments may be configured for digital-to-analog conversion circuits that may obtain digital input signal binary codes of other weights, such as a self-complementing 2-4-2-1 code and/or a 5-4-2-1 code, for example. Further, in an embodiment, through utilization of various series and/or parallel combinations of CES devices and/or by programming such CES devices to appropriate impedance states, a wide variety of implementations may be achieved from an individual digital-to-analog conversion circuit design. As mentioned, utilization of CES devices rather than, for example, n-well resistive devices provides a benefit of increased flexibility, among other potential advantages.

Figure 8:
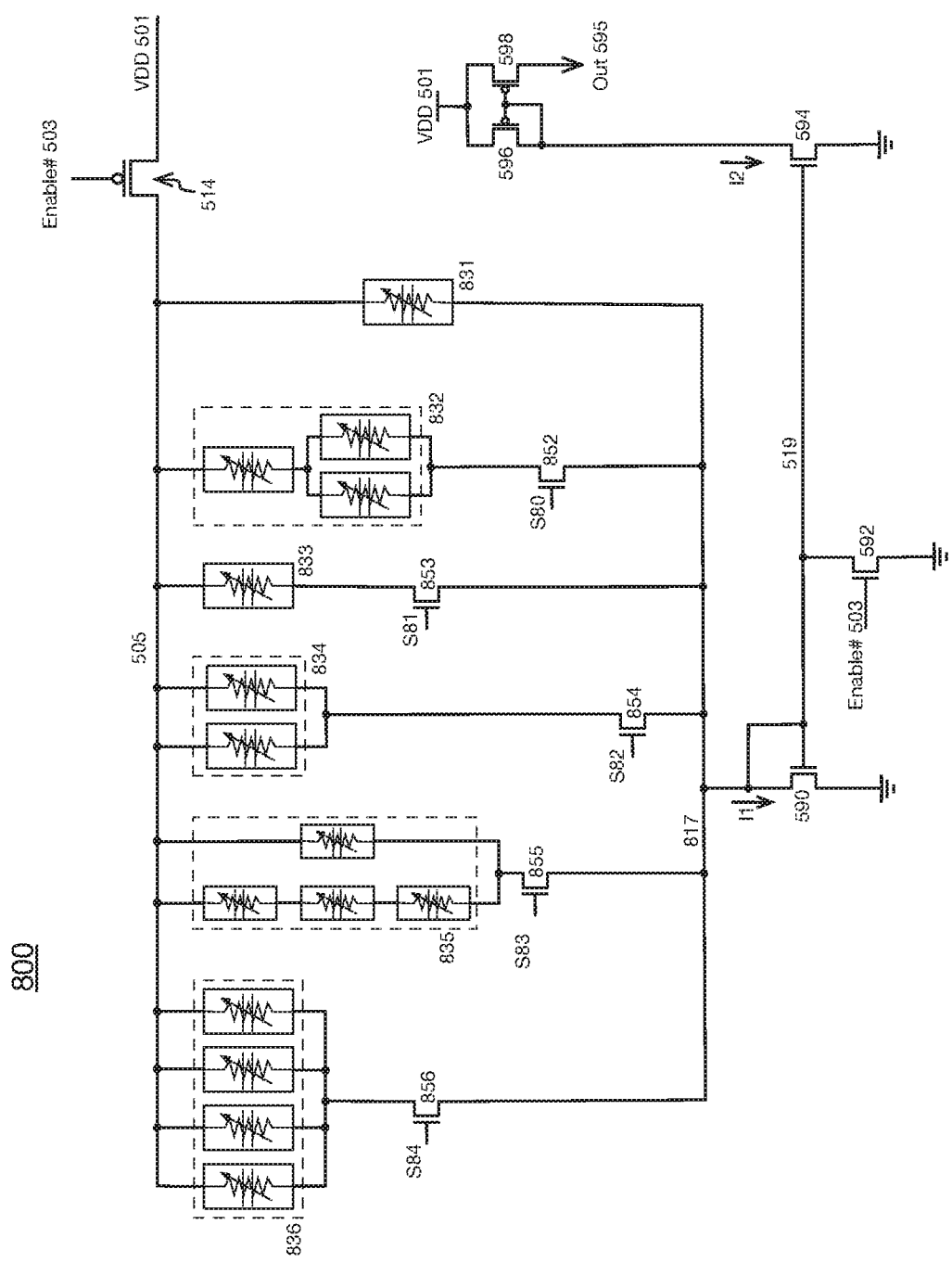
FIG. 8 is a schematic diagram depicting an example circuit for logarithmic digital to analog conversion including a plurality of programmable example correlated electron switch devices, in accordance with an embodiment.

FIG. 8 is a schematic diagram depicting an embodiment 800 of an example circuit for logarithmic digital to analog conversion. Embodiment 800 may utilize similar current mirror circuitry to that discussed above in connection with example embodiment 500 to generate an output current signal, such as Out 595. Further, example embodiment 800 may also utilize other control and/or programming and/or voltage delivery circuitry similar to that discussed above in connection with example embodiment 500 but not depicted in FIG. 8. However, claimed subject matter is not limited in scope in these respects.

In some situations, it may be desirable that an output analog voltage level and/or current level may increase exponentially with an increment of a value of a digital input signal. For example, it may be desirable to achieve greater granularity at a lower end of a digital input value domain and/or at a higher end of the digital input value domain. Table 1, below, includes example binary input values for example digital input signals, and also includes example output values as multiples of a unit current "I" for linear digital-to-analog conversion and for logarithmic digital-to-analog conversion, in an embodiment.

TABLE 1

| Binary Input Value | Linear output | Logarithmic output |
|---|---|---|
| 000 | 0 | 0 |
| 001 | I*1/8 | I*1/6 |
| 010 | I*1/4 | I*1/3 |
| 011 | I*3/8 | I*1/2 |
| 100 | I*1/2 | I*2/3 |
| 101 | I*5/8 | I*7/9 |
| 110 | I*3/4 | I*8/9 |
| 111 | I*7/8 | 1 |

In an embodiment, various combinations of parallel and/or series-configured CES devices may be arranged to provide fractional multiples of CES device impedances. See, for example, CES device banks 836, 835, 834, 833, and/or 832 of embodiment 800 depicted in FIG. 8. Further, in an embodiment, switching devices, such as switching devices 856, 855, 854, 853, and/or 852 may be enabled via logic circuitry in accordance with Boolean functions of digital input signal bits, such as bits b2, b1, and b0, for example. In an embodiment, input signal S84 may become asserted according to a Boolean function "S84=b2." Further, input signal S83 may be asserted according to a Boolean function "S83=b2.b1" and input signal S82 may be asserted according to a Boolean function "S83=b2'.b1'." Additionally, input signal S81 may be asserted according to a Boolean function "S81=b2'.b0" and input signal S80 may be asserted according to a Boolean function "S80=b2.b0'." Of course, these are merely example functions that may be utilized by logic circuitry to assert switching device enable signals, such as signals S80-S84, and claimed subject matter is not limited in scope in these respects.

Figure 9:
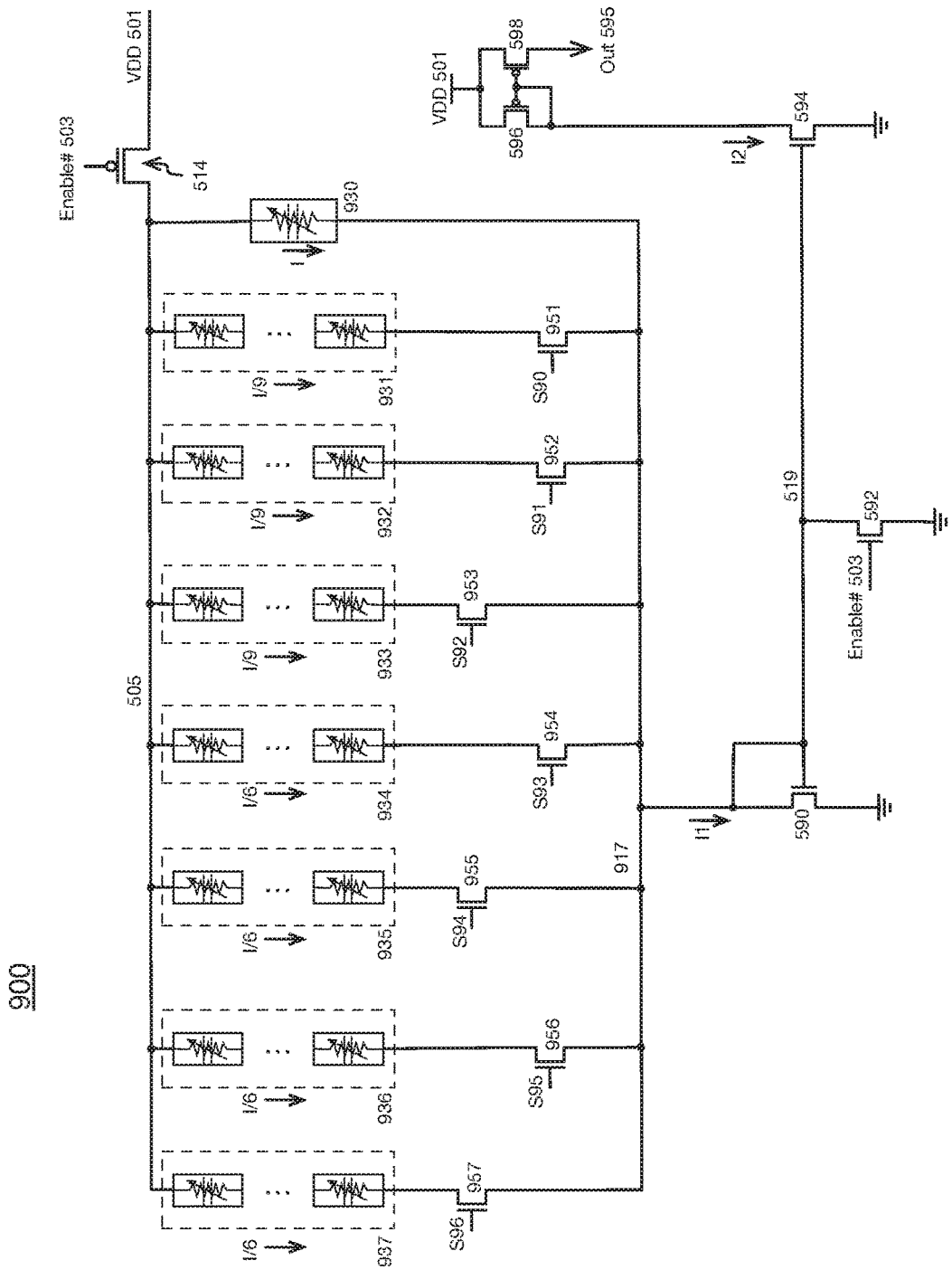
FIG. 9 depicts a schematic diagram of an additional example circuit for logarithmic digital to analog conversion including a plurality of programmable example correlated electron switch devices, in accordance with an embodiment.

As may be seen from Table 1, above, an example output of a logarithmic digital-to-analog conversion operation may increase relatively rapidly for a lower portion of the binary input bit values (e.g., <100b), whereas the output may increase relatively slowly for an upper portion of the binary bit values (>100b). Similarly, in another embodiment, a digital-to-analog conversion circuit may be implemented to increase relatively slowly for the lower portion of the binary input bit values (e.g., <100b), and increase relatively quickly for the upper portion of the binary bit values (>100b). FIG. 9, discussed below, provides an example embodiment of such a logarithmic digital-to-analog conversion circuit.

FIG. 9 depicts a schematic diagram of an additional embodiment 900 of an example circuit for logarithmic digital-to-analog conversion wherein an output current, such as a current level for Out 595, may increase relatively slowly for a lower portion of binary input bit values (e.g., <100b) for digital input signals, and may increase relatively quickly for an upper portion of binary bit values (>100b). Embodiment 900 may utilize similar current mirror circuitry to that discussed above in connection with example embodiment 500 to generate an output current signal, such as Out 595. Further, example embodiment 900 may also utilize other control and/or programming and/or voltage delivery circuitry similar to that discussed above in connection with example embodiment 500 but not depicted in FIG. 9. However, claimed subject matter is not limited in scope in these respects.

In an embodiment, a plurality of CES device banks, such as CES device banks 931-937, may comprise varying amounts of serially-configured CES devices. For example, CES banks 934-937 may individually comprise six CES devices, and/or CES banks 931-933 may individually comprise nine CES devices. An "always on" CES device, such as CES device 931, may also be provided. In an embodiment, CES banks 931-937 may be electrically coupled between node 505 and node 917 through respective switching devices 951-957. Further, in an embodiment, switching device enable signals, such as signals S90-S96, may be asserted via logic circuitry in accordance with example Boolean functions of digital input signal bits, such as bits b2, b1, and b0, for example. In an embodiment, input signal S96 may become asserted according to a Boolean function "S96=b2.b1.b0" and input signal S95 may become asserted according to a Boolean function "S95=b2.b1." Further, input signal S94 may be asserted according to a Boolean function "S94=b2.b1+b1.b0" and input signal S93 may be asserted according to a Boolean function "S93=b2." Additionally, input signal S92 may be asserted according to a Boolean function "S92=b2+b1.b0" and input signal S91 may be asserted according to a Boolean function "S91=b2+b1." Also, input signal S90 may be asserted according to a Boolean function "S90=b2+b1+b0." Of course, these are merely example functions that may be utilized by logic circuitry to assert switching device enable signals, such as signals S90-S96, and claimed subject matter is not limited in scope in these respects. Also, although embodiment 900 implements an example three-bit digital-to-analog conversion circuit, other embodiments may implement conversion operations for few bits and/or greater numbers of bits, and again claimed subject matter is not limited in scope in these respects.

Figure 10:
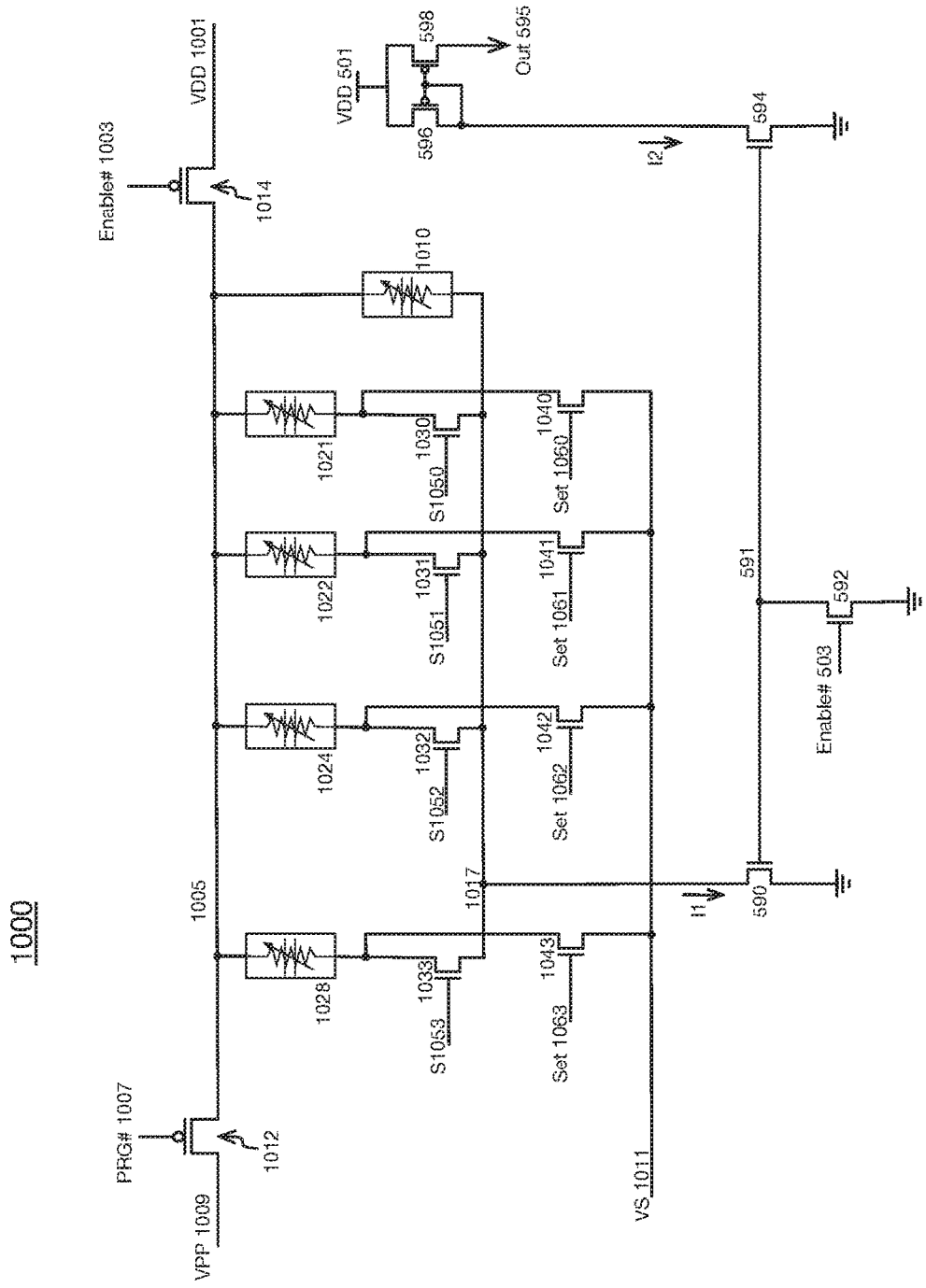
FIG. 10 depicts a schematic block diagram of an example circuit for digital to analog conversion including a plurality of programmable example correlated electron switch devices, in accordance with an embodiment.

FIG. 10 depicts a schematic block diagram of an embodiment 1000 of an example circuit for digital-to-analog conversion. Example embodiment 1000 may including a plurality of programmable example CES devices, such as CES devices 1010, 1021, 1022, 1024, and/or 1028. Further, in an embodiment, one or more of CES devices 1021, 1022, 1024, and/or 1028 may represent banks of CES devices, such as may be configured in parallel or series, or a combination thereof, similar to example configurations described above. Of course, claimed subject matter is not limited in scope to the particular arrangement and/or configuration of CES devices depicted and/or described in the example embodiments included herein.

As mentioned, CES devices, such as CES devices and/or banks 1021, 1022, 1024, and/or 1028, may be utilized as impedance elements that may be programmed to different impedance states. In an embodiment, a plurality of switching devices, such switching devices 1030, 1031, 1032, and/or 1033, which may comprise NMOS transistors, for example, may be enabled individually in accordance with digital content input signals S1050, S1051, S1052, and/or S1053.

During normal digital-to-analog conversion operation for example embodiment 1000, a programming signals, such as Set 1060, Set 1061, Set 1062, and/or Set 1063, may be de-asserted, and an enable signal, such as Enable#1003, may be asserted. At least in part in response to an assertion of Enable#1003, switching device 1014, which may comprise a PMOS transistor, for example, may electrically couple supply voltage VDD 1001 to node 1005.

Further, in an embodiment, to program CES devices and/or banks 1021, 1022, 1024, and/or 1028, one or more programming signals, such as one or more of Set 1060, Set 1061, Set 1062, and/or Set 1063, may be asserted and Enable#1003 may be de-asserted. Assertion of one or more of Set 1060, Set 1061, Set 1062, and/or Set 1063 may enable one or more of switching devices 1040, 1041, 1042, and/or 1043, which may comprise NMOS transistors, for example, to permit current flow between CES devices and/or banks 1021, 1022, 1024, and/or 1028 and a node VS 1011. Further, in an embodiment, by asserting one or more of Set 1060, Set 1061, Set 1062, and/or Set 1063 and by asserting PRG#1007, a programming voltage, such as VPP 1009, may be applied across one or more of CES devices and/or banks 1021, 1022, 1024, and/or 1028 between node 1005 and node VS 1011.

In an embodiments, VPP 1008 and/or VS 1011 may be set to voltage levels appropriate to apply particular compliance current levels to one or more CES devices and/or banks 1021, 1022, 1024, and/or 1028, thereby programming one or more CES devices and/or banks 1021, 1022, 1024, and/or 1028 to particular impedance levels, for example. In an embodiment, at least in part by controlling an amount of current and/or charge applied to a CES device and/or bank during a "set" programming operation, the particular amount of impedance of the CES device may be controlled, at least in part. In this manner, for example, a range of weights for particular bits of a digital content input signal may be implemented at least in part by controlling a gate voltage applied to a switching device, such as one or more of switching devices 1040, 1041, 1042, and/or 1043, for example, during a programming operation. Additionally, in an embodiment, a voltage level for VS 1011 may also be controlled independently, for example, to apply any of a range of compliance currents to one or more CES devices and/or banks, such as one or more of CES devices and/or banks 1021, 1022, 1024, and/or 1028, and therefore produce a range of impedance levels for one or more CES devices and/or banks.

Figure 11:
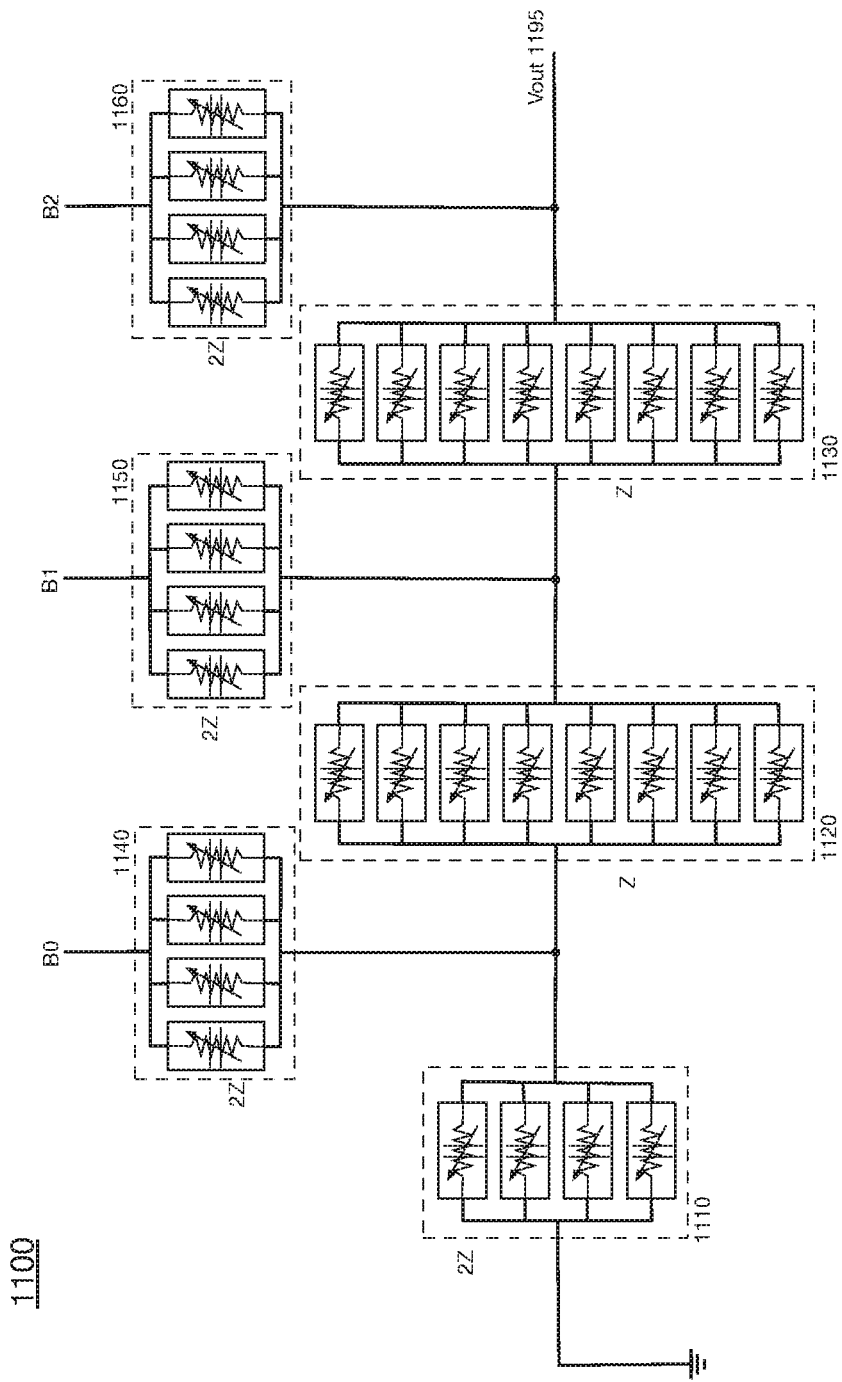
FIG. 11 depicts a schematic block diagram of an example voltage-mode ladder circuit for digital to analog conversion including a plurality of programmable example correlated electron switch devices, in accordance with an embodiment.

FIG. 11 depicts a schematic block diagram of an embodiment 1100 of an example voltage-mode ladder circuit for digital-to-analog conversion including a plurality of CES devices, such as CES devices of CES device banks 1110, 1120, 1130, 1140, 1150, and/or 1160. In an embodiment, the example configuration of embodiment 1100 may comprise a ladder circuit for digital-to-analog conversion. In an embodiment, to reduce potential negative effect from local manufacturing process variations, multiple CES devices may be configured in parallel for individual legs of the example ladder circuit of embodiment 1100. For example, in an embodiment, if a relatively lower impedance state of a CES device is assumed, by way of example, to comprise an impedance level of 100 k, but process variations result in CES devices of 110 k, a digital-to-analog conversion output signal may exhibit little change from that expected because the ratios of impedances are what determine, at least in a relatively large part, an output signal for a digital-to-analog conversion circuit such as the example circuits described herein. Further, local variations in manufacturing process may be averaged out over the several paralleled CES devices in example configurations such as that depicted in embodiment 1100.

Although embodiment 1100 includes a particular configuration of CES devices for a particular number of bits of a digital content input signal, claimed subject matter is not limited in scope in these respects.

Figure 12:
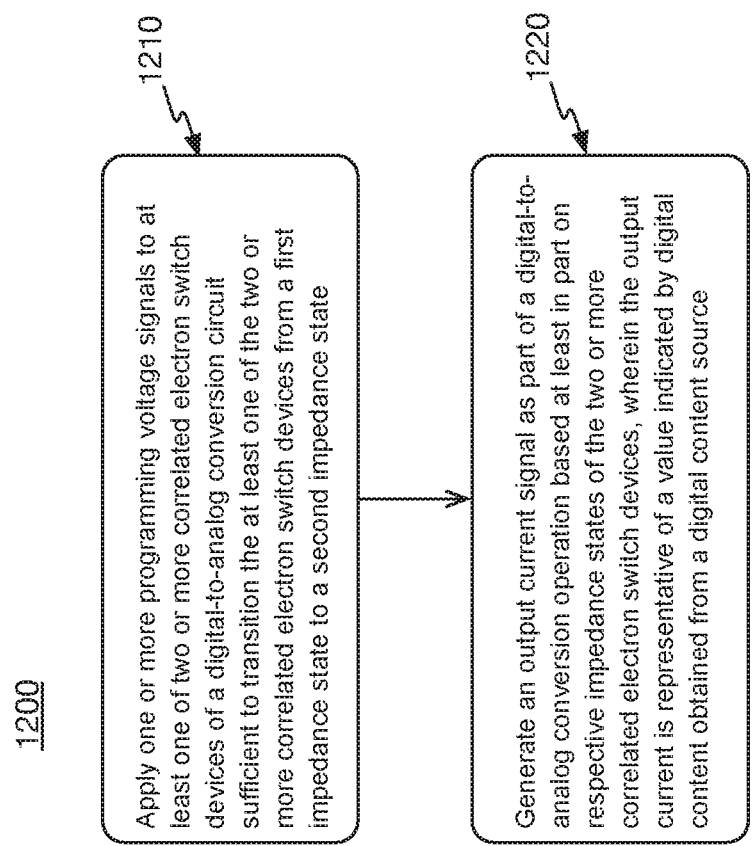
FIG. 12 depicts a simplified flowchart for an example process for digital to analog conversion, in accordance with an embodiment.

FIG. 12 depicts a simplified flowchart for an embodiment 1200 of an example process for digital to analog conversion. Embodiments in accordance with claimed subject matter may include all of blocks 1210-1220, fewer than blocks 1210-1220, or more than blocks 1210-1220. Also, the order of blocks 1210-1220 is merely an example order, and claimed subject matter is not limited in scope in this respect.

At block 1210, one or more programming voltage signals may be applied to at least one of two or more CES devices of an example digital-to-analog conversion circuit sufficient to transition the at least one of the two or more CES devices from a first impedance state to a second impedance state. Further, at block 1220, an output current signal may be generated as part of an example digital-to-analog conversion operation based at least in part on respective impedance states of the two or more CES devices, wherein the output current signal level is representative of a value indicated at least in part by digital content obtained from a digital content source, such as a processor.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
   obtaining one or more signals and/or states representative of digital content at digital-to-analog conversion circuitry comprising a plurality of sets of correlated electron switch devices, wherein the plurality of sets of correlated electron switch devices are individually programmable to one or more impedance states of a plurality of impedance states;
   programming one or more of the plurality of sets of correlated electron switch devices to a first particular impedance state or one or more of the plurality of sets of the correlated electron switch devices to a second particular impedance state, or a combination thereof; and
   generating an output signal utilizing the digital-to-analog conversion circuitry based, at least in part, on one or more characteristics of the digital content and based, at least in part, on respective impedance states of the plurality of sets of correlated electron switch devices.

2. The method of claim 1, wherein the plurality of sets of correlated electron switch devices respectively comprise one or more correlated electron switch devices.

3. The method of claim 1, wherein the programming the one or more of the plurality of sets of correlated electron switch devices includes programming the one or more of the plurality of sets of correlated electron switch devices to a relatively higher impedance state or the one or more of the plurality of sets of the correlated electron switch devices to a relatively lower impedance state, or a combination thereof.

4. The method of claim 3, wherein the programming the one or more of the plurality of sets of correlated electron switch devices comprises obtaining one or more control signals, wherein the one or more control signals controls, at least in part, the programming of the one or more of the plurality of sets of correlated electron switch devices.

5. The method of claim 1, wherein the one or more signals and/or states representative of the digital content comprises one or more individual signals and/or states representative of a respective one or more individual bits of the digital content.

6. The method of claim 5, wherein the generating the output signal comprises selectively enabling electrical current flow through one or more of the plurality of sets of correlated electron switch devices based, at least in part, on individual voltage levels of the individual signals and/or states representative of the individual bits of the digital content.

7. The method of claim 6, wherein the plurality of sets of correlated electron switch devices are arranged in a parallel manner, and wherein one or more individual sets of the plurality of sets of correlated electron switch devices includes a plurality of correlated electron switch devices arranged in parallel or a plurality of correlated electron switch devices arranged in series, or a combination thereof.

8. The method of claim 7, wherein the digital-to-analog conversion circuitry comprises multi-bit current-mode digital-to-analog conversion circuitry, and wherein the plurality of sets of correlated electron switch devices are configured in a weighted-impedance configuration wherein different sets of the plurality of sets of correlated electron switch devices respectively comprise different amounts of correlated electron switch devices.

9. The method of claim 7, wherein one or more of the plurality of sets of correlated electron switch devices respectively corresponding to one or more relatively more significant bits of the digital content includes a first plurality of correlated electron switch devices arranged in parallel, and wherein another one or more of the plurality of sets of correlated electron switch devices respectively corresponding to one or more relatively less significant bits of the digital content include a second plurality of correlated electron switch devices arranged in series.

10. An apparatus, comprising:
    a digital-to-analog conversion circuit to comprise a plurality of sets of correlated electron switch devices, wherein the plurality of sets of correlated electron switch devices to be individually programmable to one or more impedance states of a plurality of impedance states, and wherein one or more of the plurality of sets of correlated electron switch devices to be programmed to a first particular impedance state or one or more of the plurality of sets of correlated electron switch devices to be programmed to a second particular impedance state, or a combination thereof, the digital-to-analog conversion circuit to obtain one or more signals and/or states representative of digital content, the digital-to-analog conversion circuit to generate an output signal based, at least in part, on one or more characteristics of the digital content and based, at least in part, on respective impedance states of the plurality of sets of correlated electron switch devices.

11. The apparatus of claim 10, wherein the plurality of sets of correlated electron switch devices individually to comprise one or more correlated electron switch devices.

12. The apparatus of claim 11, wherein respective correlated electron switch devices of the plurality of sets of correlated electron switch devices are to be individually and/or collectively programmable to a relatively higher impedance state or a relatively lower impedance state, or a combination thereof.

13. The apparatus of claim 10, wherein the digital-to-analog circuit further to obtain one or more control signals, wherein the digital-to-analog circuit to program one or more of the plurality of sets of correlated electron switch devices at least in part in response to the one or more control signals.

14. The apparatus of claim 11, wherein the one or more signals and/or states representative of the digital content to comprise one or more individual signals and/or states representative of a respective one or more individual bits of the digital content.

15. The apparatus of claim 14, wherein the digital-to-analog circuit further to comprise one or more switch devices to correspond to one or more of the plurality of sets of correlated electron switch devices, and wherein the digital-to-analog circuit to generate the output signal via selective enablement of the one or more switch devices based, at least in part, on individual voltage levels of the individual signals and/or states representative of the individual bits of the digital content.

16. The apparatus of claim 15, wherein the plurality of sets of correlated electron switch devices to be arranged in a parallel manner, and wherein the output signal to comprise a summation of individual currents to flow through respective individual sets of the plurality of sets of correlated electron switch devices.

17. The apparatus of claim 16, wherein one or more individual sets of the plurality of sets of correlated electron switch devices to include a plurality of correlated electron switch devices to be arranged in parallel or a plurality of correlated electron switch devices to be arranged in series, or a combination thereof.

18. The apparatus of claim 17, wherein the digital-to-analog conversion circuit to comprise a multi-bit current-mode digital-to-analog conversion circuit, and wherein the plurality of sets of correlated electron switch devices to be configured in a weighted-impedance configuration wherein different sets of the plurality of sets of correlated electron switch devices respectively to comprise different amounts of correlated electron switch devices.

19. The apparatus of claim 17, wherein one or more of the plurality of sets of correlated electron switch devices respectively to correspond to one or more relatively more significant bits of the digital content to include a first plurality of correlated electron switch devices to be arranged in parallel, and wherein another one or more of the plurality of sets of correlated electron switch devices respectively to correspond to one or more relatively less significant bits of the digital content to include a second plurality of correlated electron switch devices to be arranged in series.

* * * * *